United States Patent [19]

Blackstone et al.

[11] Patent Number: 5,164,813
[45] Date of Patent: Nov. 17, 1992

[54] NEW DIODE STRUCTURE

[75] Inventors: Scott C. Blackstone, Needham; Philip L. Hower, Concord; Elizabeth M. Roughan, Newton; Christopher H. Doucette, Clinton; Roy Lee, Andover; Carolyn Q. Cotnam, Waltham, all of Mass.

[73] Assignee: Unitrode Corporation, Billerica, Mass.

[21] Appl. No.: 700,107

[22] Filed: May 8, 1991

Related U.S. Application Data

[63] Continuation of Ser. No. 202,148, Jun. 24, 1988, abandoned.

[51] Int. Cl.$^5$ .................. H01L 29/48; H01L 21/300
[52] U.S. Cl. .................................................. 257/623
[58] Field of Search ................ 357/68, 56, 73, 76, 357/72

[56] References Cited

U.S. PATENT DOCUMENTS

| | | | |
|---|---|---|---|
| 3,375,418 | 3/1968 | Garnache et al. | 317/235 |
| 3,823,352 | 7/1974 | Pruniaux et al. | 437/153 |
| 3,878,008 | 4/1975 | Gleason et al. | 357/56 |
| 3,896,478 | 7/1975 | Henry | 357/56 |
| 3,956,820 | 5/1976 | Swartz et al. | 357/56 |
| 3,988,765 | 10/1976 | Pikor | 357/56 |
| 4,029,542 | 6/1977 | Swartz | 357/71 |
| 4,236,122 | 11/1980 | Cho et al. | 357/56 |
| 4,319,265 | 3/1982 | Rosen et al. | 357/56 |

(List continued on next page.)

FOREIGN PATENT DOCUMENTS

| | | |
|---|---|---|
| 0256397 | 2/1988 | European Pat. Off. |
| 2349938 | 4/1974 | Fed. Rep. of Germany |
| 2546564 | 5/1976 | Fed. Rep. of Germany |
| 2373879 | 7/1978 | France |
| 55-123155 | 9/1980 | Japan |
| 0058273 | 5/1981 | Japan ................. 357/56 |
| 57-17167 | 1/1982 | Japan |
| 59-5630 | 1/1984 | Japan |
| 59-5664 | 1/1984 | Japan |
| 59-229865 | 12/1984 | Japan |
| 63-141376 | 6/1988 | Japan |

OTHER PUBLICATIONS

Olmstead, "Improved transistor structure", RCA Technical Notes, TN. 838, Oct. 1969, pp. 1–3.
Bassous, "Bonding together surfaces coated with silicon dioxide", IBM TDB, vol. 19, No. 7, Dec. 1976, pp. 2777–2778.
Baliga, Jayant B., Fellow, IEEE: Analysis of a High-Voltage Merged p-i-n/Schottky (MPS) Rectifier; Corporated Research and Development, General Electric Company, Schenectady, N.Y. 12301, IEEE Log No.—8715453.

(List continued on next page.)

Primary Examiner—Andrew J. James
Assistant Examiner—Viet Q. Nguyen
Attorney, Agent, or Firm—Weingarten, Schurgin, Gagnebin & Hayes

[57] ABSTRACT

A new diode structure is provided by bonding two semiconductor materials together having a low capacitance, a large contact area and mechanical ruggedness. The cross-sectional area of at least one of the semiconductor materials is reduced in the region of the bond resulting in a structure with either an hourglass or truncated hourglass-like cross-section. A diode PN junction is contained in the neighborhood of the area of reduced cross section. The diode so constructed provides a sufficient spacing between the unbonded semiconductor regions to reduce total packaged diode capacitance without introducing a spacer layer. The diode is processed to limit the area of the PN junction formed therein to the region of the bonding between the semiconductor materials, without limiting the metallized contact area, further controlling the diode capacitance as well as other electrical characteristics. The outer ends of the diode parallel to the bond, comprising typically P and N type semiconductor regions, are typically connected to metal leads which comprise the diode leads and the diode is packaged to form a mechanically and electrically stable low capacitance diode. This diode can be encapsulated such that no void or cavity exists within the interior of the structure without changing the diode construction process.

23 Claims, 14 Drawing Sheets

U.S. PATENT DOCUMENTS

| | | | |
|---|---|---|---|
| 4,402,128 | 9/1983 | Blackstone | 29/591 |
| 4,499,656 | 2/1985 | Fabian et al. | 357/56 |
| 4,526,665 | 7/1985 | Tanielian et al. | 204/192 C |
| 4,546,375 | 10/1985 | Blackstone et al. | 357/23.4 |
| 4,549,926 | 10/1985 | Corboy, Jr. et al. | 156/612 |
| 4,578,142 | 3/1986 | Corboy, Jr. et al. | 156/612 |
| 4,582,559 | 4/1986 | Tanielian et al. | 156/603 |
| 4,586,240 | 5/1986 | Blackstone et al. | 29/571 |
| 4,638,552 | 1/1987 | Shimbo et al. | 29/576 J |
| 4,661,834 | 4/1987 | Varteresian et al. | 357/81 |
| 4,671,846 | 6/1987 | Shimbo et al. | 29/629 |
| 4,698,901 | 10/1987 | Davies et al. | 357/56 |
| 4,700,466 | 10/1987 | Nakagawa et al. | 437/247 |
| 4,707,197 | 11/1987 | Hensel et al. | 437/189 |
| 4,717,681 | 1/1988 | Curran | 437/31 |
| 4,728,626 | 3/1988 | Tu | 437/126 |
| 4,729,006 | 3/1988 | Dally et al. | 357/23.1 |
| 4,734,749 | 3/1988 | Levi | 357/56 |
| 4,738,933 | 4/1988 | Richards | 357/68 |
| 4,738,935 | 4/1988 | Shimbo et al. | 437/31 |
| 4,755,858 | 7/1988 | Thompson et al. | 357/56 |
| 4,758,534 | 7/1988 | Derkits, Jr. et al. | 437/89 |
| 4,791,465 | 12/1988 | Sakai et al. | 357/25 |

OTHER PUBLICATIONS

Hashimoto, Norikazu; Koga, Yashushi: The $Si-WSi_2-Si$ Eptiaxial Structure; Journal Electrochemical Society, vol. 114, No. 11, Nov. 1967, pp. 1189–1191.

Ishiwara, et al.: Laser and Electron-Beam Solid Interactions & Materials Processing (Gibbons, J. F. edited); Materials Research Society Symposia Proceedings, 1981, pp. 525–531.

Saitoh, et al.: Double heteroepitaxy in the Si (111) $CoSi_2Si$ Structure; Appl. Phys. Lett., 37(2), Jul. 15, 1980, pp. 203–205.

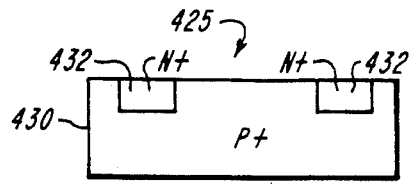
FIG. 44
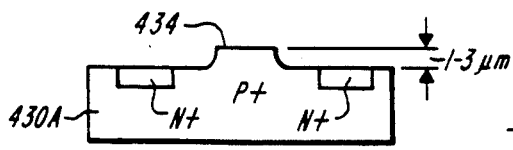
FIG. 45
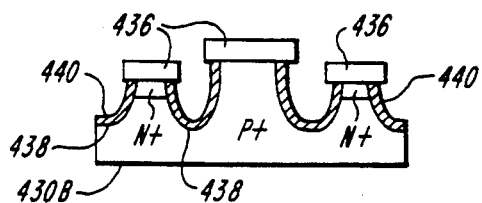
FIG. 46
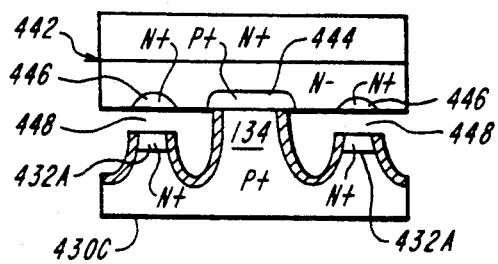
FIG. 47
FIG. 49
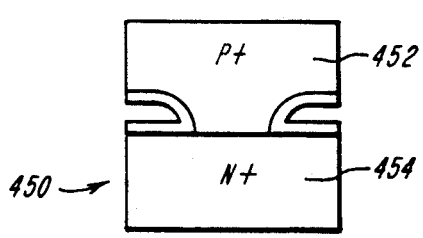
FIG. 48
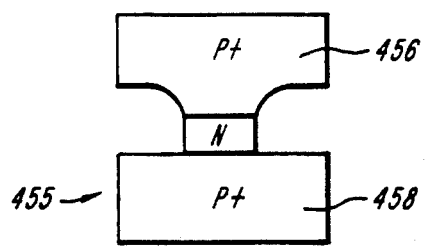
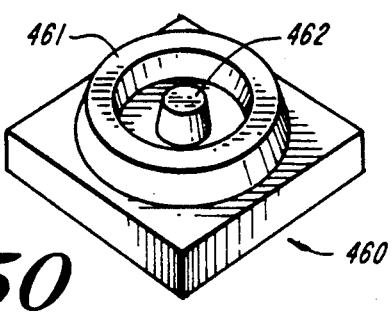
FIG. 50

NEW DIODE STRUCTURE

CROSS-REFERENCE TO RELATED APPLICATION

This application is a continuation of application Ser. No. 07/202,148, filed Jun. 24, 1988 now abandoned.

This invention is related to a corresponding U.S. utility application Ser. No. 07/202,112 entitled WAFER BONDING USING LOW TEMPERATURE NEUTRAL ALLOYS by Scott C. Blackstone, filed on even date herewith.

FIELD OF THE INVENTION

The present invention relates to discrete semiconductor diodes and rectifiers, and in particular, low capacitance semiconductor diode structures.

BACKGROUND OF THE INVENTION

Low capacitance signal diodes, as exemplified by a standard part number 1N4148, which have a total packaged capacitance of approximately one picofarad (pF) comprise a planar junction structure 50 as illustrated in FIG. 1. In such diodes, the capacitance arises from two primary sources, the first being the PN junction semiconductor capacitance 52 and the second being the capacitance between the semiconductor substrate 65 and the pin 54 as well as pin 56 to pin 54 capacitance. These capacitances are in parallel and thus add to form the total capacitance. To minimize the capacitance of this structure, the area of the PN junction is reduced to typically 20-30 square mils and the spacing between the pins as well as the die and the pins is increased by inserting a plated silver ball 58. The silver ball provides a 2 mil spacing between the semiconductor and the pin while providing a conductive path between the pin 54 and the P type region 60. The resulting structure is surrounded by glass 62 to provide a hermetic seal. Glass 62 may be pushed in to abut the semiconductor 65 in some areas.

The insertion of the silver ball lowers the capacitance but reduces the contact area of the top contact 67 to typically less than 20% of the backside contact 68 and introduces a mechanical strain due to the large mismatch of the coefficient of thermal expansion between the silver ball and the semiconductor as well as the glass and pins. In addition, the silver ball is malleable but not resilient and will work harden and shrink during thermal cycling. As a result, diode failures, either in stress testing or in practice, are almost always associated with the silver ball.

As a result of the problems with the plated silver ball approach, attempts have been made to provide a diode without a silver ball having a complete semiconductor structure between the connecting pins. However, such diodes 70 illustrated in FIG. 2, exemplified by the 1N4148-TXV produced by Microsemi Corporation of California, require an unusually elongated and fragile mesa 72 extending between the connecting pins 73 and 74 to achieve a low capacitance diode. Even with this very fragile structure, the capacitance is still typically twice that of the silver ball type construction (about 2 pF). The reason for the fragile structure and the higher capacitance is that the height provided by the silver ball has to be made up by additional semiconductor material. When mesa semiconductor regions are formed to produce the diode characteristics, the area of the semiconductor contact region 75 must be smaller than the junction area 76. The thicker the N type layer, the bigger the difference between the contact area and the junction area. This means that the N type layer should be kept as thin as possible, increasing the die-to-pin (78-73) and pin-to-pin (74-73) capacitance. Because of strength requirements, the top of the mesa has a minimum dimension which forces the PN junction area 76 to have an even bigger dimension and thus increasing the junction capacitance as well. In addition to higher capacitance, the area of the top contact is now even smaller than with the silver ball approach. However, this large mesa 72 structure does allow the glass 79 to be pushed completely in forming a voidless or cavity free structure. This part is made using the more expensive Tungsten pins and high temperature glass as opposed to the Dumet pins and soft glass of the typical DO-35 packaged 1N4148.

A further problem of conventional PN junction diodes is demonstrated when the diodes are put into reverse breakdown such that they go into thermal runaway. In such circumstances, the diode internal temperature is sufficient to allow destructive alloying to occur. Such destructive alloying is produced by the metallization on the semiconductor material melting and alloying through the junction area. Thus, diodes subjected to thermal runaway produce metallized conductive paths through the junction of the diode, making the diode now permanently conductive. Upon removal of the reverse breakdown condition, the diode fails to recover its previous operating characteristics and is rendered permanently defective.

SUMMARY OF THE INVENTION

The present invention is a low capacitance, planar or mesa junction diode which will allow void-free packaging having a resistance to mechanical, thermal and reverse breakdown stresses. The diode is made using a direct wafer bonding process of two semiconductor materials. One embodiment of the diode is formed by growing epitaxial silicon on one of the two surfaces of the semiconductor surfaces to be bonded. The epitaxial layer can be of the same doping type (N or P type) as the substrate or the opposite. Either of the semiconductor surfaces can be patterned using mesa techniques prior to bonding to the other semiconductor surface. One embodiment for an epitaxial layer of the same polarity as its substrate is to mesa the non-epitaxial surface prior to bond. A planar junction is formed within the epitaxial layer after bonding. A second embodiment is to mesa the epitaxial surface of the same polarity of its substrate prior to bond. A mesa junction is then formed within the epitaxial layer after bonding. For an epitaxial layer of the polarity opposite to its substrate, mesas are formed in the epitaxial surface prior to bond. A mesa junction is within the epitaxial layer is provided. The junction passivation can be provided before or during the bonding step or a combination of techniques.

The planar junction structure provides the lowest leakage junctions for diodes with breakdown voltages of under a few hundred volts. The mesa junction structures would be useful for diodes with breakdown voltages in excess of a few hundred volts, although any structure could be used for any of these applications. In addition to superior electrical and mechanical performance of the above exemplified diodes, they also allow a shorter and easier wafer manufacturing process than with conventional methods.

The mesa height of the planar junction diode is selected to be sufficient to reduce the capacitance introduced by the spacing of the unbonded semiconductor surfaces. This allows the junction area to be maximized while also maximizing the strength of the structure. This is also true for the mesa junction structure because the mesa height only has to be as deep as the lightly doped epitaxial layer, unlike the conventional structure where it has to include a thick heavily doped region on top of the lightly doped epitaxial layer. Moreover, since the junction is far from the metallization of the conducting pins, the resulting diode exhibits significantly enhanced resistance to destructive alloying from reverse breakdown.

The resulting diode structure is typically mounted between connecting pins and enclosed in a glass structure to provide a truly void-free construction, if desired. As this die has no silver ball or other low temperature materials, it can be mounted in either a Dumet pin DO-35, DO-7 type construction or into a tungsten pin, hard glass thermally matched construction such as Part No. UES 1001, available from Unitrode Corporation.

Moreover, the resulting diode structure facilitates the fabrication of a void-free construction in either package. This diode also has a large metallurgical bond area on both sides of the diode so that the electrical contact resistance and thermal resistance are minimized, and the mechanical strength is maximized.

BRIEF DESCRIPTION OF THE DRAWINGS

These and further features of the present invention will be better understood by reading the following detailed description, taken together with the drawing, wherein:

FIG. 29 is deleted;

FIG. 30 is deleted;

FIGS. 44-47 are cross-sectional views of semiconductor material and diode formed and bonded according to a further alternate embodiment of the present invention;

FIG. 48 is a cross-sectional view of an alternate embodiment of the present invention comprising a low breakdown voltage Zener diode;

FIG. 49 is a cross-sectional view of an alternate embodiment of the present invention showing the construction of a bidirectional Zener diode; and FIG. 50 is an isometric view of an alternate embodiment of FIG. 5, including an annular reinforcement structure surrounding the diode.

DETAILED DESCRIPTION OF THE INVENTION

A typical "half hourglass" profile diode according to the present invention is made according to the process steps for the planar junction embodiment shown in FIGS. 3A-3D and in one embodiment of the mesa junction in FIGS. 4A-4D and a second mesa junction embodiment shown in FIGS. 4E-4H. The embodiment shown in FIGS. 4A-4D include a P+ wafer and an N+ wafer with an N-type epitaxial layer grown on one of them. One of the wafers is patterned to form mesas and then the two wafers are bonded and further processed according to the present invention.

Figure 1:
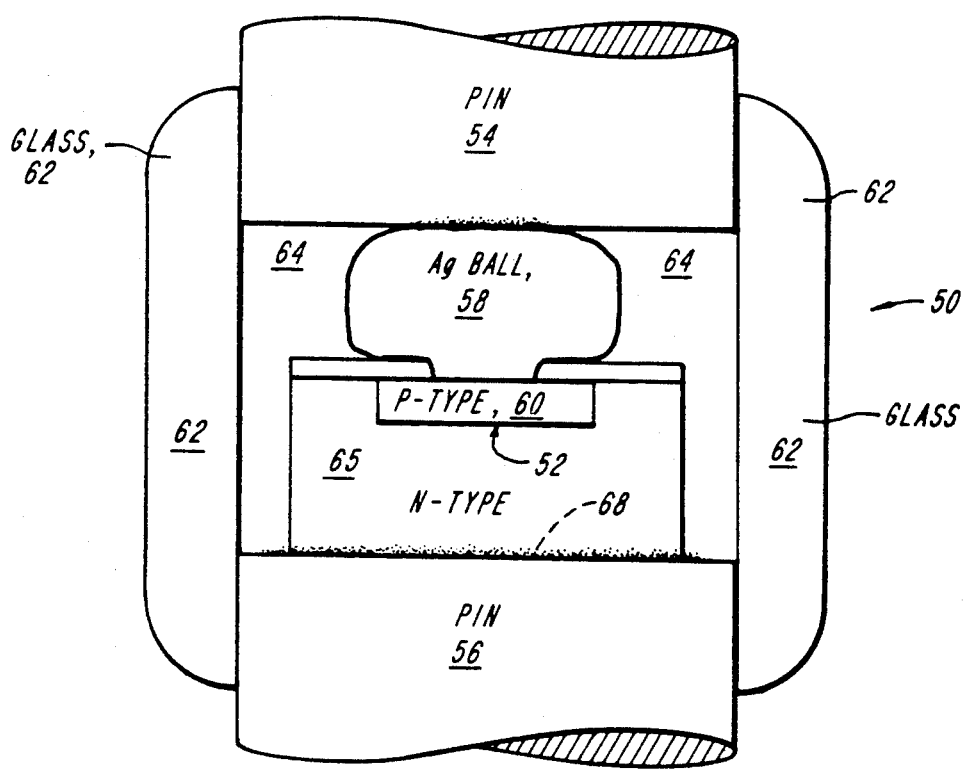
FIG. 1 is a cross section of a prior art diode, type 1N4148.
Figure 2:
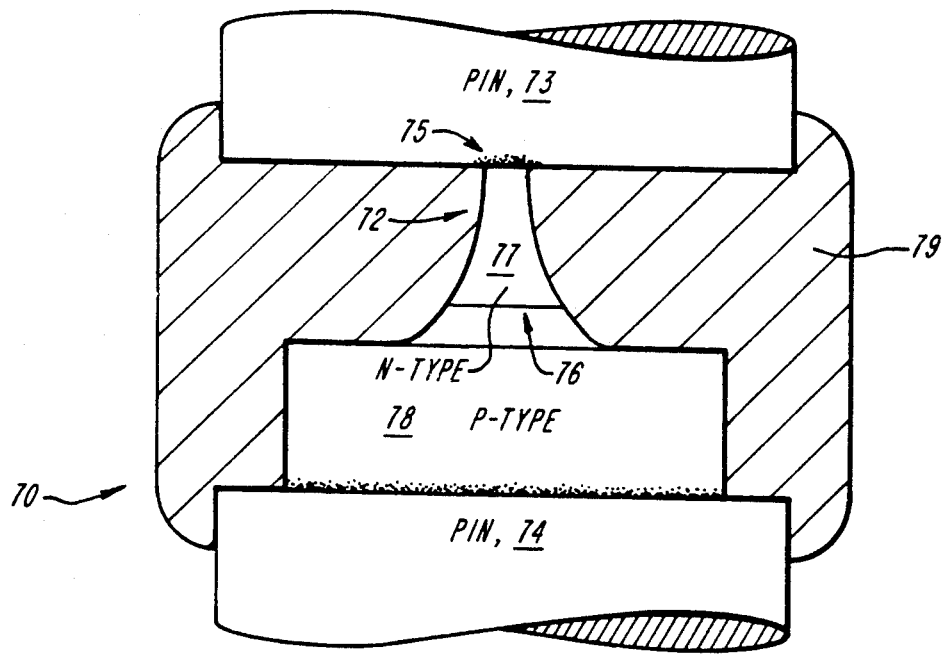
FIG. 2 is a prior art diode of alternate manufacture.
Figure 3A:
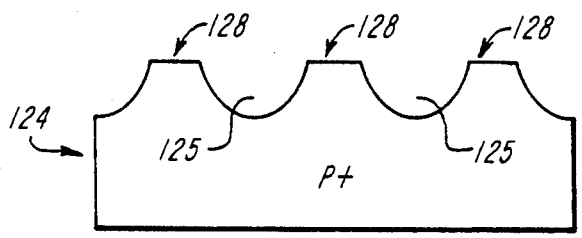
FIGS. 3A-3D cross-sectional views of semiconductor materials showing the steps and resulting structure of one embodiment of the present invention.
Figure 3B:
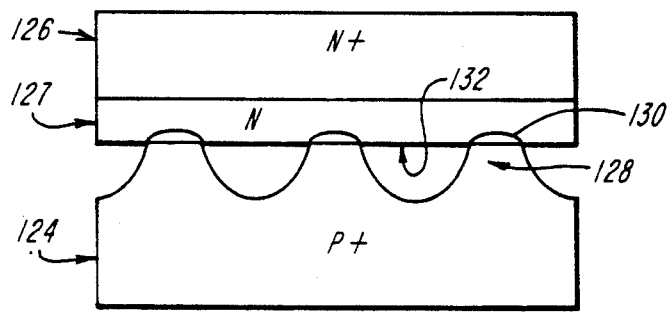
Figure 3C:
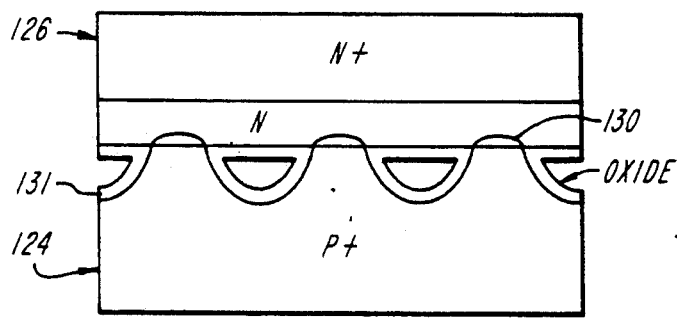
Figure 3D:
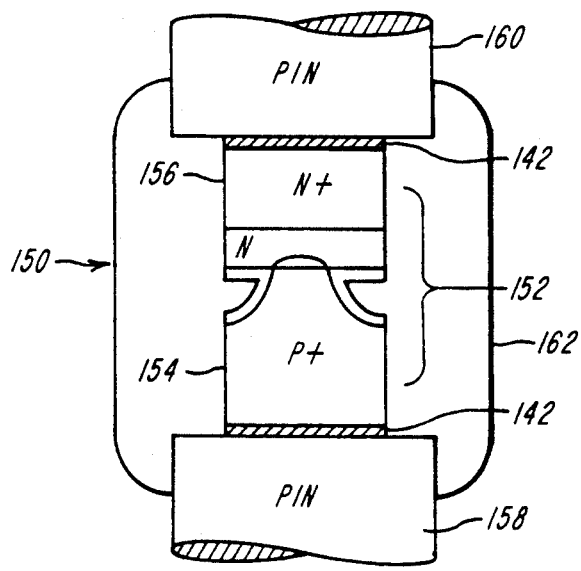

To produce the finished embodiment shown in FIG. 3D, which comprises a truncated hourglass or "half hourglass" diode, one of the semiconductor wafers, such as the P+ wafer 124, is processed as illustrated in FIG. 3A to provide a plurality of moats 125 at regular intervals providing mesas 128 at regular intervals on the surface of the wafer 124. Next an N+ wafer 126 with an N epitaxial layer 127 grown on it is bonded to the P+ wafer 124 as shown in FIG. 3B, wherein the N region 127 of the wafer confronts the mesas 128 of the P+ wafer 124 and is bonded thereto. The N epitaxial layer 127 has a doping and thickness consistent with the diode characteristics desired.

The bonding is done by placing the two wafers together in a furnace and heating them until a solid bond is achieved. This can be typically achieved by a surface preparation followed by a heat treatment of 1100° C. for several hours in a nitrogen atmosphere. It can alternatively be achieved according to a process of Unitrode Corporation co-pending patent application entitled WAFER BONDING USING LOW TEMPERATURE NEUTRAL ALLOYS U.S. Ser. No. 07/202,112 herein incorporated by reference.

As previously mentioned, although the P+ material 124 has been processed to create the mesas 128 and bonded to an N epitaxial surface 127 of the N wafer 126, the semiconductor wafers may be reversed wherein the N+/N (indicating substrate/epitaxial doping structure) wafer is processed to have the mesas and the P+ wafer is unprocessed to retain a plane surface, as shown in FIGS. 4E-4H. Alternately, both semiconductor wafers may be similarly processed to provide the full "hourglass" diode shown in FIGS. 4J and 4K.

Figure 4A:
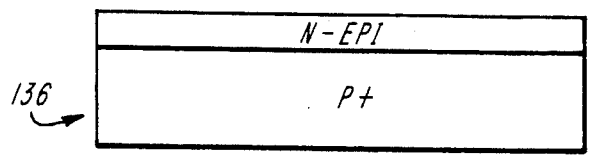
FIGS. 4A-4D are cross-sectional views of semiconductor materials showing the steps and resulting structure of a second embodiment of the present invention.
Figure 4B:
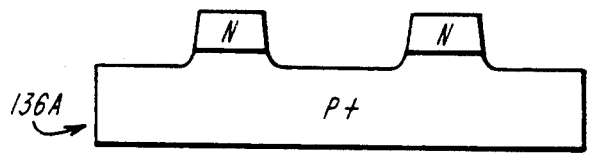
Figure 4C:
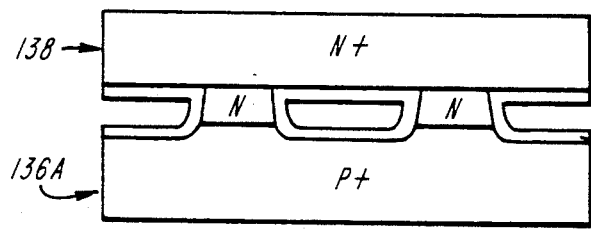
Figure 4D:
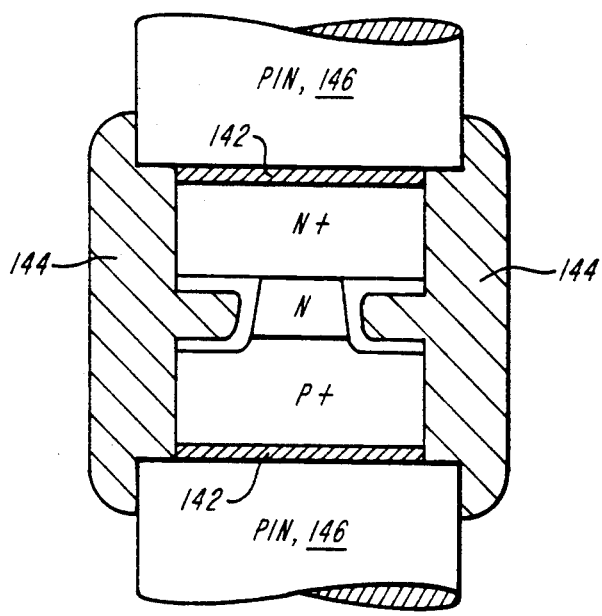
Figure 4E:
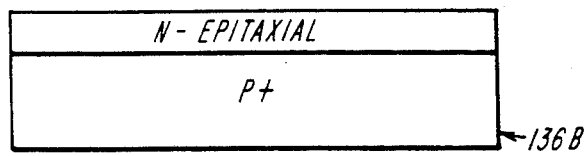
FIGS. 4E-4H cross-sectional views showing the steps and resulting structure of the embodiment of FIGS. 4A-4D having complementary semiconductor materials.
Figure 4F:
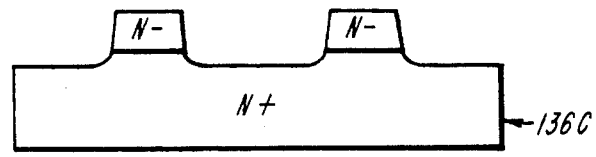

The mesa construction process of FIGS. 4A-4D shows a P+/N wafer 136, FIG. 4A, patterned (shown as 136A in FIG. 4B) and bonded to an N+ water 138, FIG. 4C, but these may also be reversed, in that a N+/P wafer may be patterned and bonded to a P+ wafer or both wafers may contain an epitaxial layer and/or both wafers may be patterned. Moreover, a special case also exists for producing a controlled breakdown voltage diode (commonly provided by a Zener breakdown). For low breakdown voltages this construction would produce a structure in a P+ or an N+ wafer and bond it directly to an N+ or P+ wafer without the use of an epitaxial layer; alternately, both wafers could also be patterned.

Figure 4G:
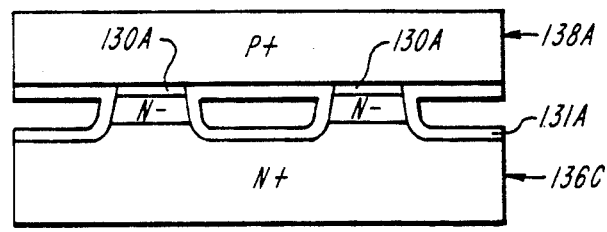
Figure 4H:
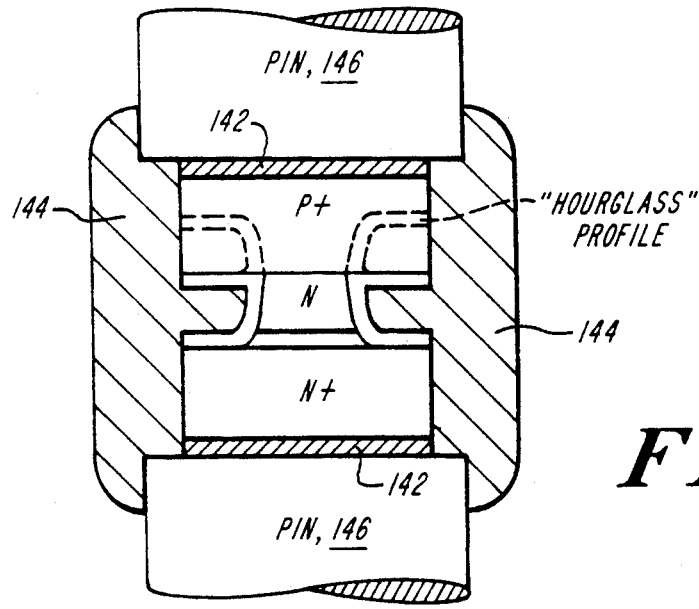
Figure 4J:
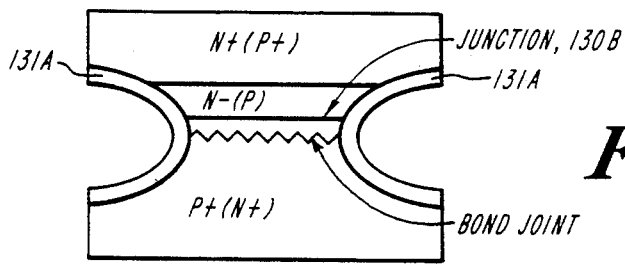
FIGS. 4J-4K are cross-sectional views of further alternative mesa junction embodiments of the present invention showing the full hour-glass construction.
Figure 4K:
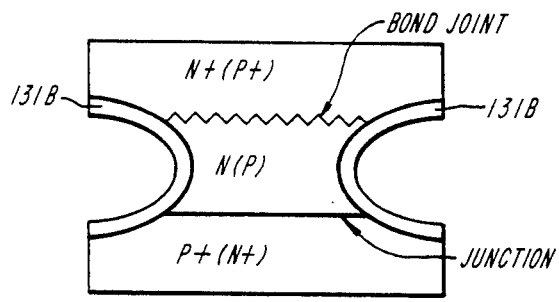

When the wafers are bonded, as shown in FIG. 3B, 4G or 4J, the P+ or N+ wafer dopant diffuses from the substrates into the epitaxial layer forming a PN junction 130, 130A and 130B within the epitaxial region and near but not at the bonded interface.

Passivation can be done before bonding or during bonding by introducing oxygen or by a combination of techniques. The passivation layer 131 can include such materials as thermal or deposited oxide, SIPOS, silicon nitride, etc. A typical passivation cycle would be to bond the wafer at 1100° C. in oxygen for several hours. If the moat depth exceeds a minimum depth of about a few tenths of a mil, the oxide grown throughout the "interior" of the wafer can be comparable to an oxide grown on a single plane wafer.

The composite wafer is then reduced in thickness, (e.g., ground or lapped) if desired, lowering the resistance of the diode, as well as removing the passivation layer(s) on the unbonded back surfaces of each of the wafers, thus saving a contact patterning step. The wafer is then metallized on both sides with the appropriate metal system 142 for the intended package. A typical completed bonded wafer would have a total thickness of about 12 mils and be coated with silver for the tungsten (W) or molybdenum (Mo) pin package or typically titanium/nickel/silver for the Dumet pin package. The diode element is then enclosed by a glass covering, such as 144 in FIG. 4D. To provide one embodiment of the voidless seal, it is required that the pin-to-die bond be done in a conventional sealer that allows it to first reduce the pressure under heat, seal the glass on the pins, and then while the glass is still soft, increase the pressure to push the glass into the cavities in the interior of the package. Thus, according to the present invention, a sealed, voidless diode structure having a low capacitance is provided. Other voidless seal techniques may be applied according to the present invention.

From a manufacturing point of view, the present invention requires only one non-aligned photo step and a minimum of one furnace step for the bonding/passivation. This compares to a conventional process which typically requires separate masks for diffusion, contact opening, and plating or metallization at least, plus many furnace steps. This reduced processing should result in improved yield and reduced cycle time leading to a cost savings over the current manufacturing methods.

FURTHER EMBODIMENTS

Figure 5:
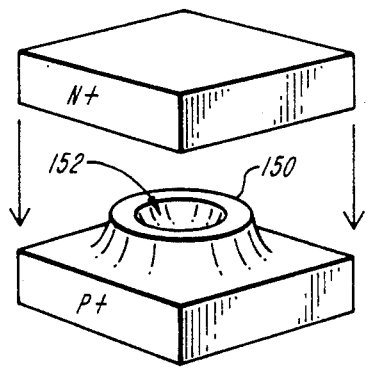
FIG. 5 is an isometric view of an annulus structure according to an alternate embodiment of the present invention.

1. The embodiment of FIGS. 3 and 4 shows a mesa of arbitrary geometry, such as a square or a circle; an alternate embodiment an annular diode structure (including a mesa 150) as shown in perspective in FIG. 5 and in cross section in FIG. 6, which is hollow after bonding. As the present diode structure represents a new approach to diode fabrication, there are few restrictions to the shape of the region of the bond between the semiconductor materials from which the diode junctions arise. These may be adapted to form other shapes, such as the annulus wafer elevation 150, as in FIG. 5. This structure could have advantages over a solid mesa. One advantage would be to further distribute the mechanical forces imposed on the diode structure. Another advantage is to select the ratio of the cross-sectional area to the perimeter, or for the mesa structure, the sidewall area.

Figure 6:
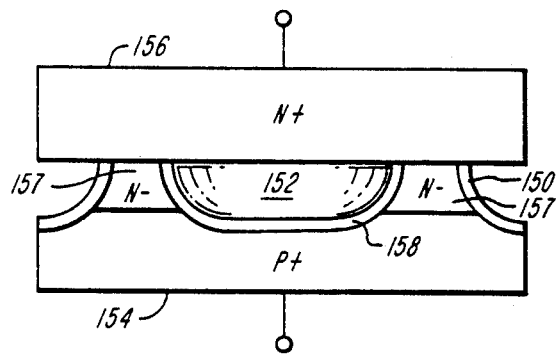
FIG. 6 shows the cross-sectional view of the annulus structure of FIG. 5.

The cavity 152 formed inside the hollow mesa 150 would be a hermetically sealed chamber of a well-controlled atmosphere, or a vacuum. This annular structure then would make the production of a void-free package easier, as the glass of the package would not have to travel as far into the interior of the die to seal it. Since the interior portion 152 of the annular bonded structure of FIG. 6 is not accessible to the bonding furnace atmosphere subsequent to bonding, the passivation layer 158 may need to be provided before the N type layer 157 and P type layer 154 are bonded as described elsewhere in this application.

Figure 7:
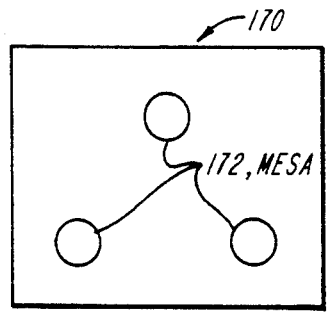
FIGS. 7 and 8 are plan and elevation views of a further alternate embodiment comprising a multiple mesa structure.
Figure 8:
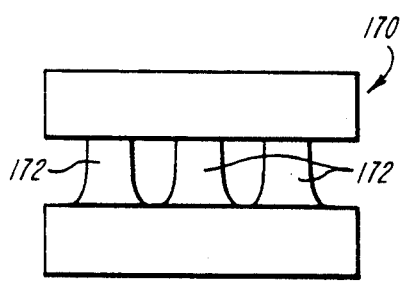

2. A second alternate embodiment of this invention comprises a multiple mesa structure. An example of this is shown in FIGS. 7 and 8, in which the single mesa is replaced by three mesas 172 concentrically distributed around the diode element 170. The advantage of this structure embodiment is that it further distributes the mechanical forces imposed on the diode structure, as well as allowing a variation of the ratio of junction area to perimeter or for the mesa, sidewall area. This could be accomplished not only with circular mesas but with various shapes, such as linear arrays or other shapes. Thus many small mesas would contain more sidewall area and thus result in faster recombination of the minority carriers, producing a faster switching speed. Moreover, this structure, which would allow large sidewall surface area, could increase the speed without additional processing without increasing the forward voltage.

Figure 9:
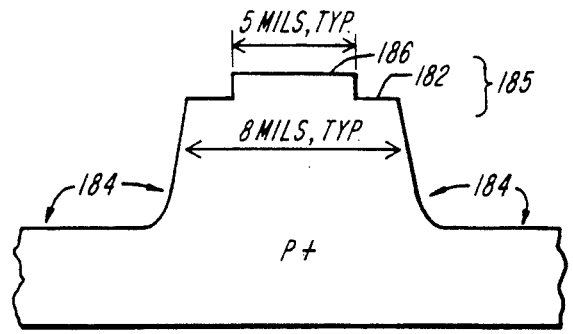
FIGS. 9, 10 and 11 are cross-sectional views of semiconductor material and diodes in an embodiment including field plate structures in the mesa.
Figure 10:
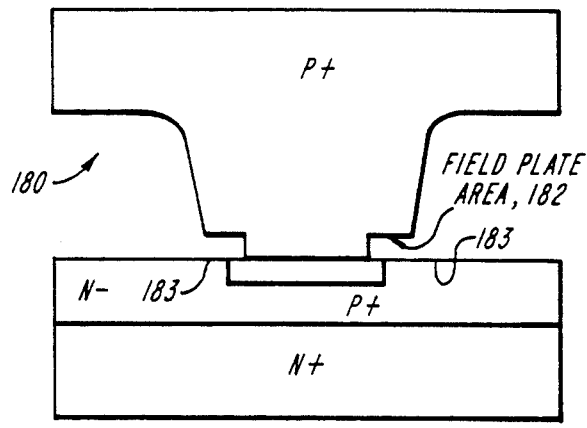

3. The embodiment discussed above has a solid mesa which was formed in a single masking step, resulting in a plateau with sloping sidewalls to the bottom of the mesa. The steps for a third alternative embodiment 180 provide a specific mesa shape for the planar diode structure to introduce a selected field plate 182 as shown in FIGS. 9 and 10. The field plate 182 controls the electrical field distribution within the semiconductor region of the diode. A typical field plate 182 is formed, as shown in FIG. 9, on a P+ wafer by etching two moats, one deep 184 as in the conventional structure, and a smaller moat 186 within the mesa 185, to produce a field plate which overhangs the junction at an optimal distance. A typical example would be to make the unrecessed mesa 186 5 mils in diameter for a 1N4148. equivalent, and the diameter of the field plate 182 8 mils, so that it typically overhangs 1.5 mils on either side of the bonded interface or typically about 1 mil beyond the junction. One embodiment provides a lightly recessed field plate 182 region approximately 1 micron deep, and the deeply etched moat 184 could be typically 1 mil deep.

Figure 11:
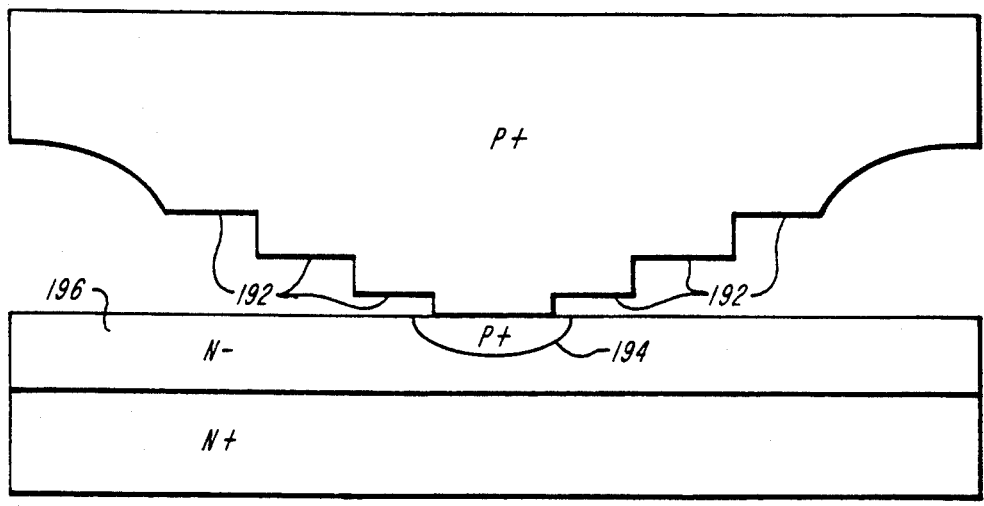

In the resulting structure shown in FIG. 10, only the unrecessed mesa will bond, allowing the overhanging recessed field plate region 182 to impose a field across the semiconductor region 183 under it. Before, during or after bonding, an oxide could be grown such that the region under the field plate would be filled with oxide. If the oxide (not shown) was grown thermally, since the oxide would be growing from both sides of the structure, a gap as large as 4 microns could be oxidized shut. Although it is not necessary to fill the field plate gap, it may be desirable because it gives better control over the effect of the field plate structure. The single gap field plate structure shown in FIG. 10 is only the simplest case, and further embodiments include a multiplicity of field plates 192 at various gap distances to provide high voltage structures, such as shown in FIG. 11. In this case multiple patterning and etching can be used to form the structure. For high voltage structures, the gap between the unbonded surfaces of the outside mesa may be large enough that it is not possible to thermally oxidize it shut. In this case a closed structure may be obtained by depositing a layer of material on top of the oxide which is consistent with the rest of the structure, such as a layer of polycrystalline silicon, SIPOS, silicon nitride, or any other acceptable material.

A second advantage of this embodiment is that it has a larger mesa which is closer to the junction 194. The electrical resistance of the mesa, an important component of the total forward voltage of the diode, will be lower in this structure than the embodiment previously described. Any increase in the capacitance of the device from the capacitance of the field plate area can be offset by taking advantage of the field plate effect by adjusting the doping in the epitaxial layer 196 to reduce the junction capacitance. Therefore any given design will have a particular optimum combination of mesa resistance, field plate effect and capacitance.

Figure 12:
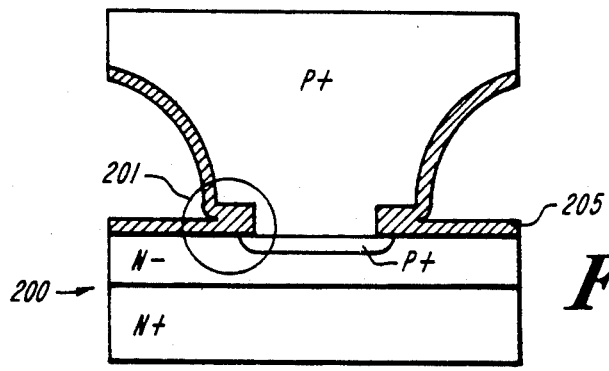
FIGS. 12-14 are cross-sectional views of diode structures in sequential manufacturing steps according to one embodiment of the present invention.
Figure 13:
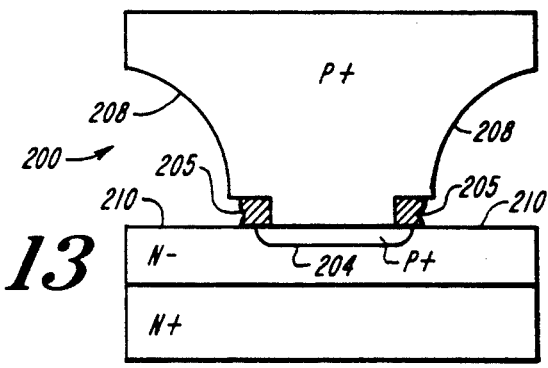
Figure 14:
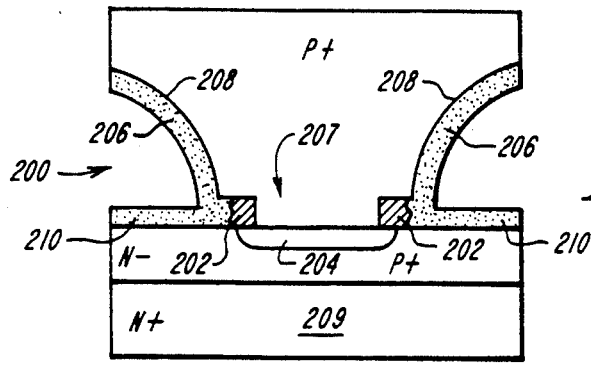

4. Steps necessary to produce a field plate structure of a further alternative embodiment 200 are shown in FIGS. 12-14. These steps allow the construction of diodes which have thermal oxide 205 passivation of the junction 204, but a barrier material 206 over the non-junction areas of the semiconductor surfaces 208 and 210. This which is useful when the die is to be put into an environment. Such as a package containing ionic contamination or a package which allows moisture to penetrate to the die, such as in plastic. As shown in FIG. 12, the field plate diode is fabricated and the field plate area 201 is oxidized shut, as previously discussed in the previous embodiment 3, above. The oxide is then etched away with a controlled over-etch such that the oxide remains in the field plate area over the active junction area, FIG. 13. For a field plate gap of 1 micron and extending 30 microns from the bonded joint, and a 1.0 micron oxide grown to close up the field plate gap, an oxide etch which removes 1 micron of oxide will also completely remove the oxide on the side walls. However, the oxide etch will only recess the oxide in the field plate region by 1 micron, leaving 29 microns of oxide covered surface in the field plate area 201. Thus the junction 204 and its lateral depletion region 210 would be passivated with a thermal oxide 205, as shown in FIG. 13. A barrier material 206 is then deposited over the structure forming a hermetic seal at the top edge (P+ area) and at the bottom edge (N+ area) of the mesa area as shown in FIG. 14. The passivating layer typically comprises silicon nitride or any other material which provides a barrier to contamination. The silicon nitride coating 206 provides a true hermetic seal of the die junction and therefore the package would only be needed to keep the exposed semiconductor materials. FIG. 14 shows a P+ mesa 207 to an N+/N wafer 209 but the opposite would also be included in the enhancement.

Figure 15:
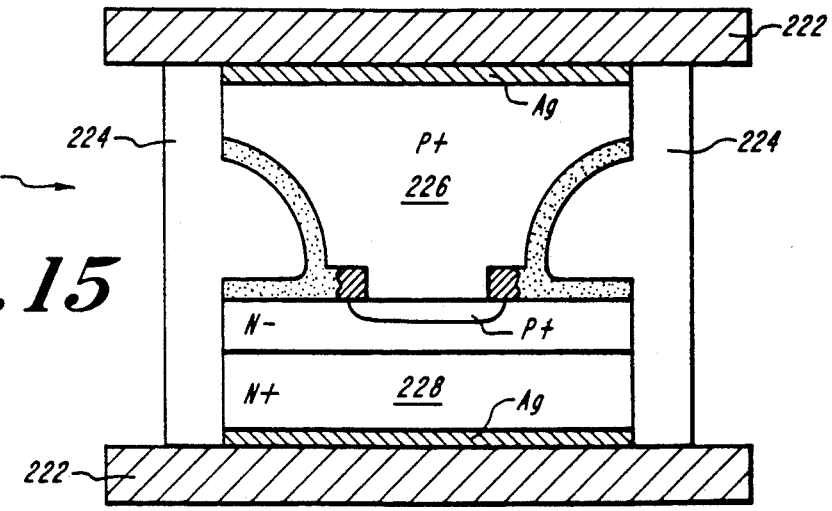
FIG. 15 is a cross section of a miniature packaged diode manufactured according to the steps of FIGS. 12-14.

A further embodiment of the above hermetic junction seal is used to make a "MELF" (Metal Electrode Leadless Faced) style surface mount package 220. This "MELF" style drop shown in FIG. 15 in which the die is soldered onto two metal discs 222 is covered with a material such as plastic 224 or glass which prevents contamination from shorting the P+ region 226 from the N+ region 228. Moreover, the coating material does not have to be a barrier to moisture or ionic contamination, but only remain an insulator.

Figure 16:
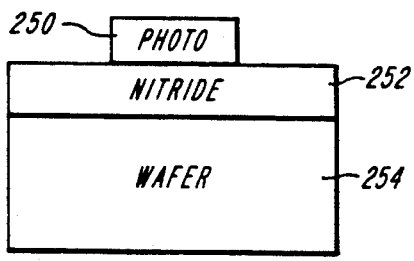
FIGS. 16-19 are cross-sectional view of semiconductor materials and diode showing process steps of a further alternate embodiment of the present invention.
Figure 17:
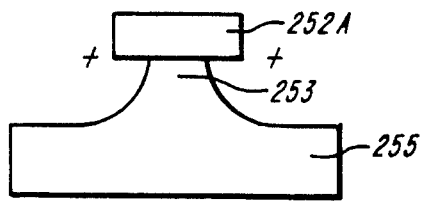
Figure 18:
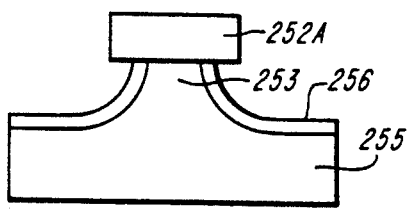
Figure 19:
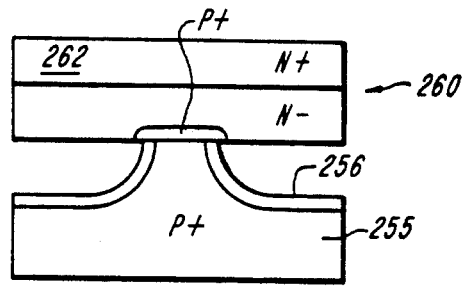

5. The present invention also includes a method of achieving a passivating layer before bonding, which prevents the free dopant from unintentionally doping a more lightly doped region as previously discussed, is shown in the steps of FIGS. 16-19. A small area of exposed, heavily doped semiconductor surface can result in the unintentional doping of more lightly doped material. Thus, in an inert bonding atmosphere, complete coverage of every surface except the surface to be bonded is necessary for a prebond passivant to work. This version of the process of the present invention, which is applied to a planar wafer structure, is also applicable for a mesa structure. In FIG. 16, the wafer 254 is covered with a thin oxide followed by a silicon nitride layer 252 or directly covered with a silicon nitride layer, and patterned to cover the tops of the mesa 253 as shown in FIG. 17. The moat is etched using the silicon nitride as a mask and then an oxide 256 is grown in the moat, FIG. 18. Only a few tens of nanometers of oxide 256 are necessary to prevent free dopant problems. This oxide will not grow under the nitride 252A as it is a diffusion barrier to oxygen. In FIG. 19, the nitride has been removed by any technique which does not attack the oxide 256, such as phosphoric acid. If an oxide "pad" is used under the nitride, the oxide will have to be removed. In this embodiment, the oxide 256 in the moat will have to be grown thicker, so that after the oxide etch, it will still be of sufficient thickness to prevent free-dopant problems. The semiconductor material 255 is now sealed with an oxide everywhere except in the bond area 262, and can now be bonded to another semiconductor material 260 using the previously described techniques.

Figure 20:
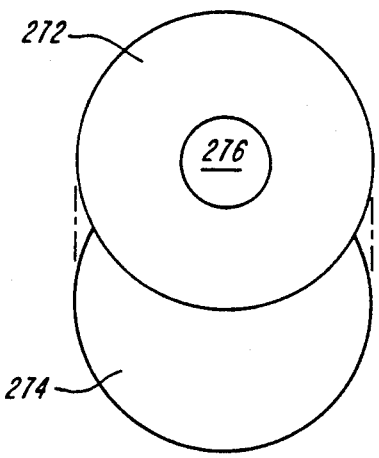
FIG. 20 shows a pair of semiconductor wafers including an aperture on one of the wafers.
Figure 21:
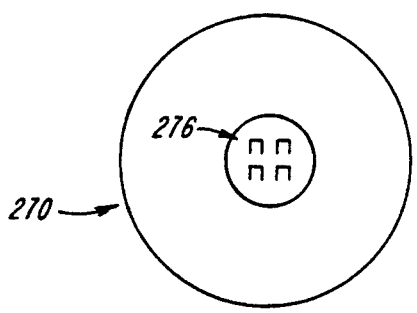
FIG. 21 shows the wafers of FIG. 20 bonded, revealing the subordinate wafer through the aperture of the overlying wafer.
Figure 22:
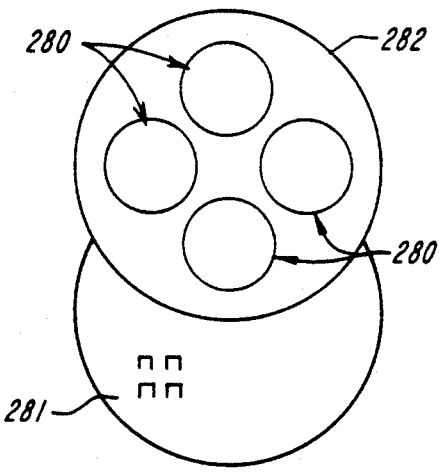
FIG. 22 shows a pair of wafers, one of which including a plurality of apertures.
Figure 23:
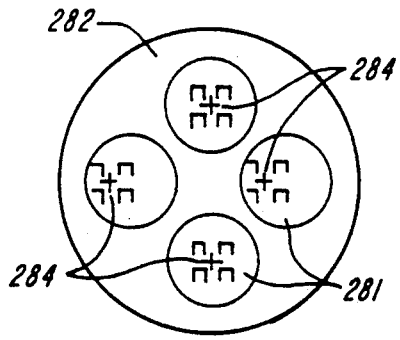
FIG. 23 shows the alignment of the overlying bonded wafers of FIG. 22.

6. Previous embodiments and enhancements discuss the use of deposited thin films or of etching structures in the interior between the two wafers after bonding. This further embodiment discusses methods of obtaining uniform coverage and etching of structures in the interior of the wafer. Good results are obtained with a deposition "window" typically every 1 to 1.5 inches using low pressure chemical vapor deposition (LPCVD) or other techniques. For a three-inch wafer 270, the structure of FIGS. 20 and 21 allows uniform deposition of LPCVD films, such as polycrystalline silicon, SIPOS, silicon nitride, etc., to better than +/−10% uniformity. One of the wafers has a aperture 276 formed in it before bonding to allow a "window" for deposition. Examples of forming the aperture 276 are chemical etching and ultrasonic milling on either or both wafers. The two wafers 272 and 274 are then bonded using the previously described techniques. The single aperture 276 shown in FIGS. 20 and 21 is the simplest case; multiple apertures are also possible and may be necessary for larger diameter wafers. Multiple apertures could provide dicing alignment as well as improved film uniformity, shown in FIGS. 22 and 23. Multiple apertures are formed on the wafer 282 does not have mesa structure. Theses aperatures are placed sufficiently far apart to be useful for alignment structures. The wafer with mesa structures contains not only the diode elements, but also has alignment structures 284 which would be visible through the apertures after bonding. After bonding and processing, the wafers can be separated into die by using the alignment structures visible through the apertures. If the apertures 280 are only used for alignment marks the apertures only need to be deep enough so that the they become visible after wafer thinning. This would then also act as a monitor on the silicon removal process. Apertures, either extending completely through the wafer and/or extending partially through the wafer could be used on the same wafer.

Figure 24:
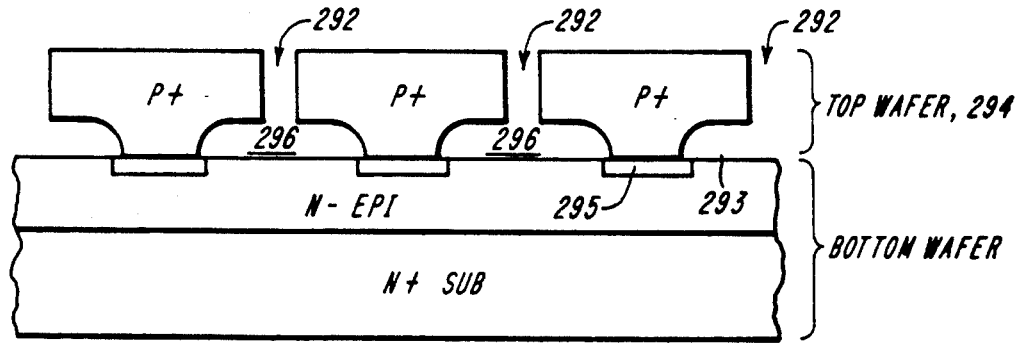
FIG. 24 is a cross-sectional view of two bonded wafers, including a plurality of saw cuts in one of the wafers.

7. A further alternative embodiment to the etched apertures described above is to use apertures, or cuts 292 through only one of the wafers 294. This technique allows a large number of access apertures to the interior areas 296 of the wafer without losing diodes, as is the case with the apertures of embodiment 6 above. These cuts are shown schematically in FIG. 24, which shows every row being cut through the (top) wafer 294 only, although this is not required. The cuts can be at any selected spacing. The cuts can be parallel or perpendicular relative to each other. The cutting can be provided before or after any wafer thinning can be performed at any time after the bonding process.

After the cuts 292 are made, the interior of the wafer is accessible for chemical processing. Some solutions such as hydrofluoric acid are able to etch oxides. Throughout the interior of a wafer without the use of apertures, but other solutions, such as buffered hydrofluoric acid, are only able to partially penetrate into the interior of the wafer before the etching characteristics are adversely effected. Various cleaning, surface preparation and wet chemical treatments, as well as plasma cleaning and etching will benefit from the presence of these cuts. Thus, the present embodiment allows successful incorporation of these processes into the fabrication of the diode. Moreover, the cuts could be formed by techniques such as sawing, etching, laser drilling, ultrasonic milling, or by any other technique.

Figure 26:
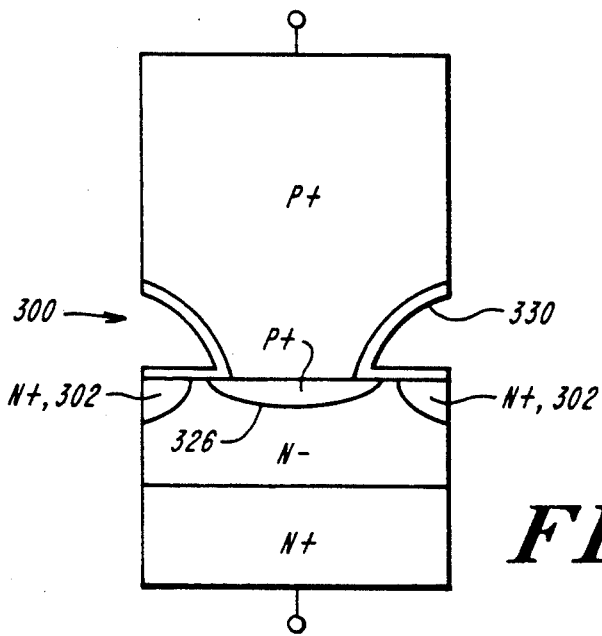
FIG. 26 is a cross-sectional view of the isolated diode element produced according to FIGS. 24 and 25.
Figure 25:
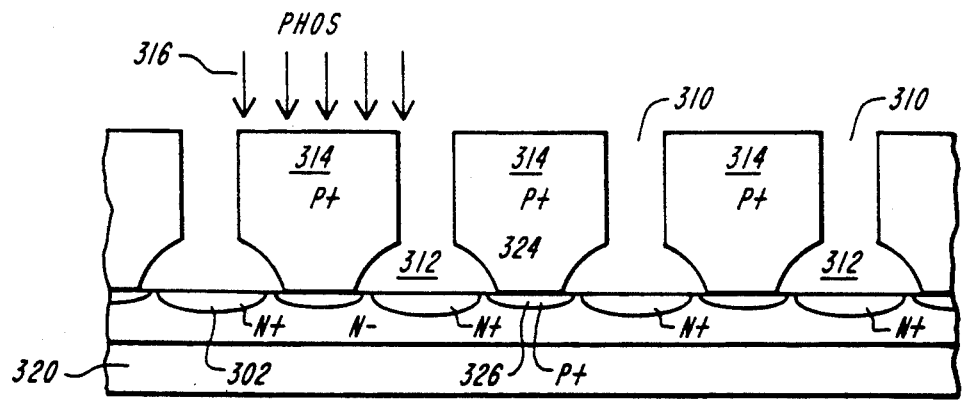
FIG. 25 illustrates the application of a material through the saw cuts of FIG. 24 and the resulting diode structure in cross section.

8. The embodiment 300 shown in FIG. 26 incorporates a channel stop 302 to surround the PN planar junction of the diode structure previously described. The channel stop 302 below the oxide 330 substantially surrounds the PN junction 326, and is formed by ion implantation, diffusion or other techniques. As shown in FIG. 25, doping is typically provided by phosphorous or arsenic 316 admitted to the surface on the N-layer of the N-wafer 320 through the access channels 310 cut into the P+ wafer 314. This results in an N+ channel stop 302 which encircles the bonded region 324 and the resulting PN junction 326. The bonded wafer is then exposed to an oxidizing agent, resulting in an oxide passivation layer 330. The resulting wafer structure is cut into individual diode elements 300 of FIG. 26.

9. The embodiment discussed above with respect to FIG. 24 is the application of glass to the structure for passivation, such as in the application of SOGO (SIPOS/oxide/glass/oxide). The wafer 294 can be cut or patterned into parallel strips on a pitch which is aligned with the disposition of the glass into the interior of the wafer, such as on every row. The glass (not shown) can then be applied using squeegee-like techniques running parallel to the cut pattern. It is not necessary to fill the interior or to use a single layer of glass. The interior surfaces near the junctions 295 or near a depletion region in the silicon should be covered. The surface of the glass could then be coated with an oxide or other material, if desired. This glass passivation help to protect the diode from ionic contamination.

Figure 27:
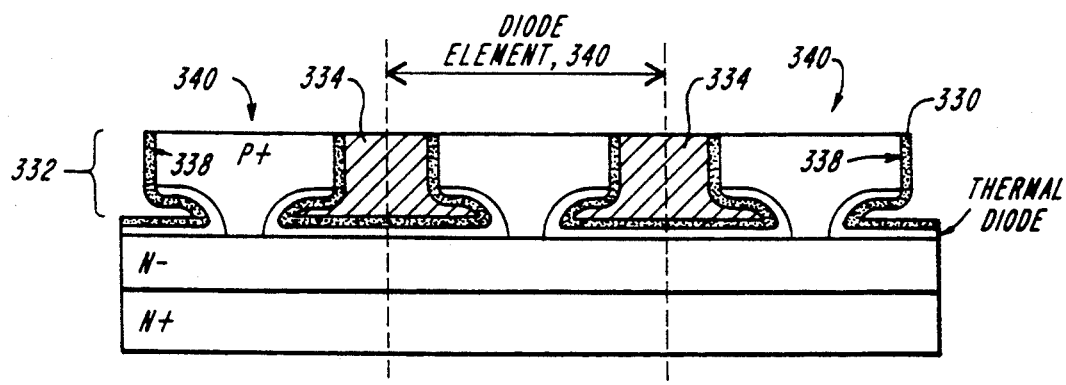
FIG. 27 is a cross-sectional view of diodes materials formed according to a further alternate embodiment, wherein the first of two bonded semiconductor materials includes saw cut apertures including a filling constituent therein.
Figure 28:
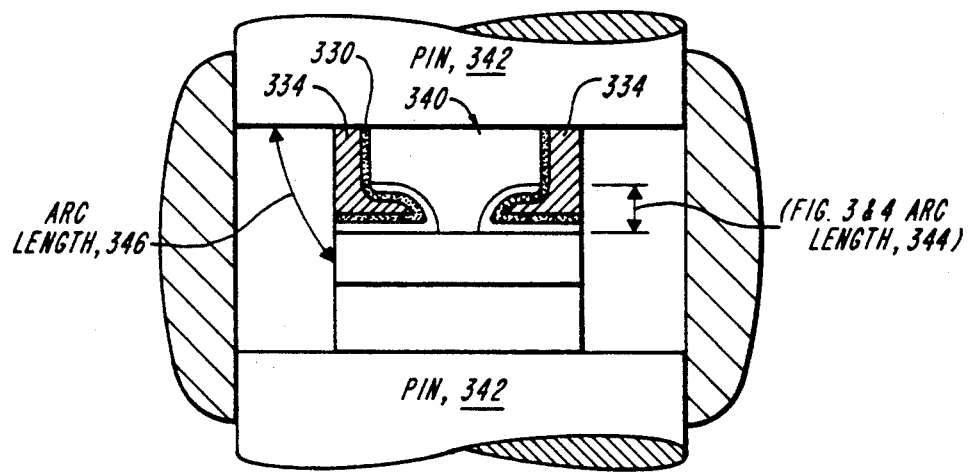
FIG. 28 is a cross-sectional view of a packaged isolated diode manufactured according to the structure shown in FIG. 27.

10. An additional embodiment comprises the fabrication of a high voltage diode in a package which does not come in contact with the semiconductor chip, FIG. 28. A problem with this package for high voltage operation is internal arcing. Arcing occurs over a path whose distance is the "arc length" 346. Even if the unpackaged diode is capable of withstanding high voltage, the voltage of the packaged diode may be limited by arcing between internal components. A structure having increased arc length 346 and thus higher voltage capability is shown in FIGS. 27 and 28.

The wafers are processed as through bonding previously described. The top wafer, 332, is then cut or otherwise patterned to separate the top of every diode element. The width of the cut is such that it will easily allow a second cut within it without touching the sidewalls of the first cut. The sidewalls are then coated with a (passivation) 330 sufficient to withstand the applied voltage. This coating could be a thermal or deposited oxide, a CVD film, such as SIPOS, silicon nitride, glass, or a combination of these. The example in FIGS. 27 and 28 shows the sidewall 338 coated with a oxide 330 and a glass layer 334. After diode element separation, the sidewalls of the P+ layer are still coated with the oxide 330 and a glass layer 334. Then the diode element 340 is packaged as shown in FIG. 28. However, an axial package is not required and other packages such as a metal can or plastic package are acceptable. Thus the arc length has been increased from the height of the mesa, labeled as FIGS. 3 and 4 arc length 344, to the distance 346 between the top of the bottom wafer and the top metallization or pin. For an axial leaded device with a total die thickness of 12 mils and a mesa of 2 mils, thus increasing the arc length from 2 mils to 5-6 mils and significantly increases the device voltage capability.

Figure 31:
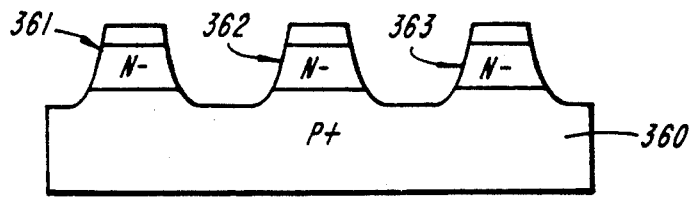
FIGS. 31-34 show cross-sectional views of semiconductor materials and diodes fabricated according to steps of a further alternate embodiment of the present invention incorporating insulated mesas providing mechanical support between the two bonded semiconductor materials.
Figure 32:
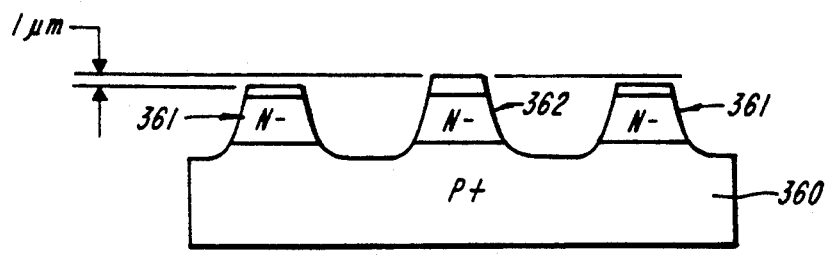
Figure 33:
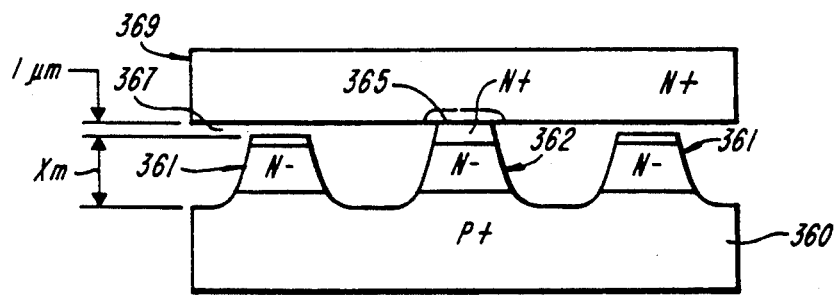
Figure 34:
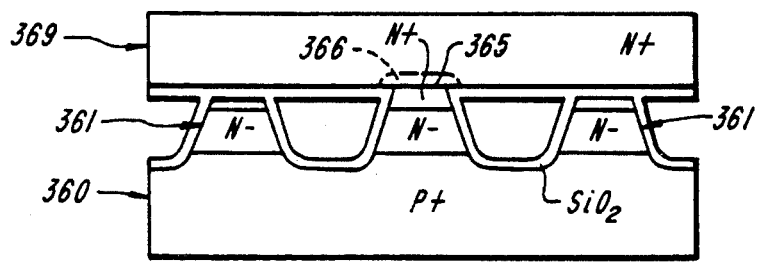

11. This embodiment provides semiconductor support structures by providing each diode element with a plurality of raised mesa areas 361 and 362 from one of the semiconductor materials, such as 360 in FIG. 31. The wafer is processed to provide the structure shown in FIG. 32, wherein the mesa structures 361 surrounding the mesa 362 are reduced in elevation by a small amount, such as one micron.

The semiconductor material 360 is bonded to a second material 369 in the regions 365 where the raised mesa 362 contacts the semiconductor material 369. The adjoining semiconductor mesas 361, having a reduced elevation, are separated from the semiconductor material 369 by the reduced amount, such as one micron. The bonded semiconductor wafer is passivated, such as with oxide, forming a layer on the opposing surfaces of the semiconductor materials 360 and 369, and filling the (one micron) gap 367 between the top of the mesas 361 and the semiconductor material 369. This provides an electrically isolated structural support according to the present embodiment.

While the present embodiment describes the creation of mesas of varied elevations which may comprise a plurality of structures distributed over the diode structure, the present embodiment also envisions mechanically reinforced structures in other shapes such as an annular ring 461 shown in FIG. 50.

Figure 35:
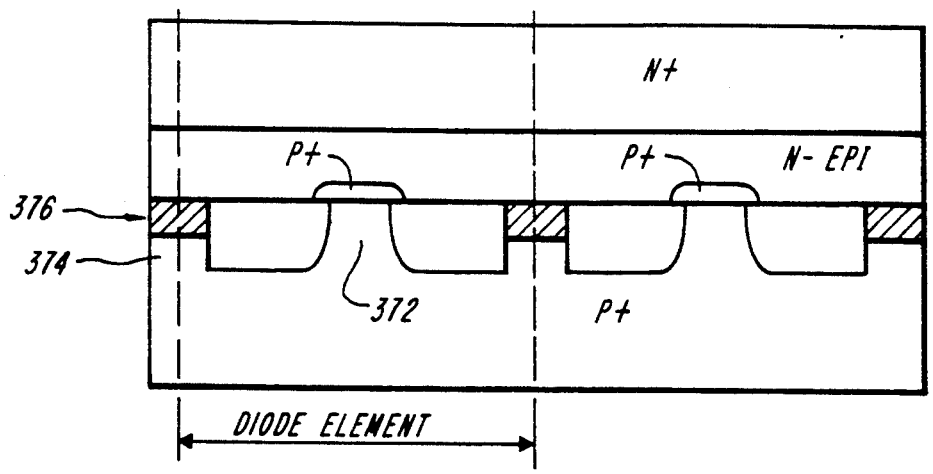
FIG. 35 is a cross-sectional view of a diode fabricated according to a further alternative embodiment of the present invention.
Figure 36:
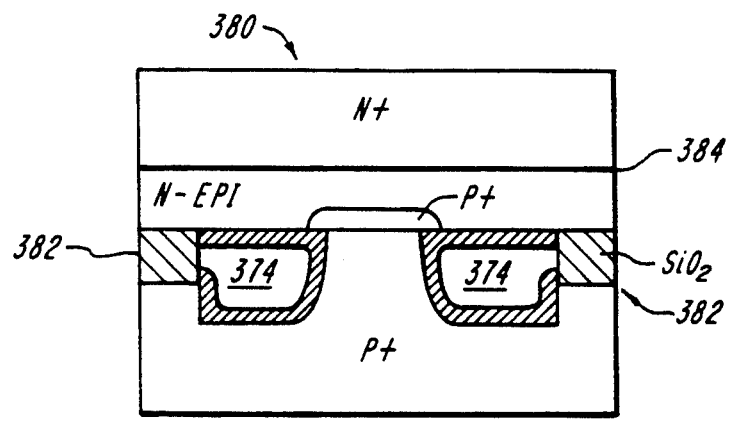
FIG. 36 is a cross-sectional view of an isolated diode element manufactured according to the structure of FIG. 35.

The process described above can be further used to make a sealed diode according to the present embodiment in which the edges of the mesa are sealed and the junction region is hermetically isolated from the external environment, as shown in FIGS. 35 and 36. The recessed mesas 374 that completely surround the diode plateau 372 will allow oxidation 376 to close the gap between the recessed mesas and the opposite wafer. If the recessed mesas are wider than the cut, then the resulting diode element 380 will be as shown in FIG. 36. The sidewalls 382 of the diode are flat and the junction area 384 is sealed. This structure may have improved mechanical strength and protection from contaminated environments.

Figure 37:
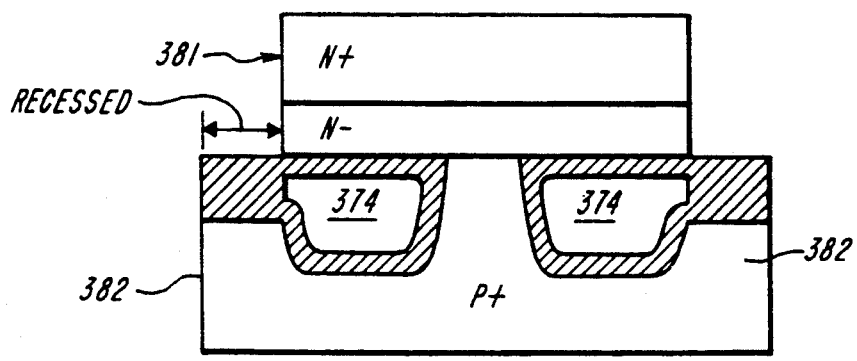
FIG. 37 is a cross-sectional view of further alternate embodiment of the diode structure of FIG. 36.
Figure 38:
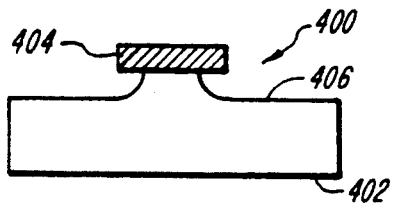
FIGS. 38-42 are cross-sectional views of semiconductor materials and diode bonded and processed according to a further alternative embodiment of the present invention.

Any additional capacitance of the structure could be reduced by laterally recessing the semiconductor material 381 over the recessed mesas, as shown in FIG. 37.

12. The present embodiment further provides a channel stop structure in a planar junction semiconductor device. The surface of the semiconductor material which received the doping material is bonded to the other semiconductor material wherein the dopant is diffused through a non-semiconductor layer or void into the other semiconductor material. The doped region is typically in an annular shape which produces a channel stop structure in the other semiconductor material. Furthermore, as the semiconductor materials are selectively spaced in the region of the channel stop diffusion, a conductive path is avoided, such that no significant capacitance is added to the diode. Therefore, a channel stop is provided without additional steps in the manufacturing process of the semiconductor.

Although the present embodiment can be applied to both N and P types semiconductor materials, a specific embodiment according to the FIGS. 38-47 is demonstrated by etching a P-type material and forming the channel stop in the N-type region. In the process 400 as illustrated by FIGS. 38-42 and discussed below, a nitride layer 404 is patterned on the P-type substrate material 402. The substrate material is subjected to an etching solution to produce a slight recess 406 of approximately 1-3 microns, providing the semiconductor material 402 just beneath the nitride layer 404 to have the corresponding relative elevation of 1-3 microns.

Figure 39:
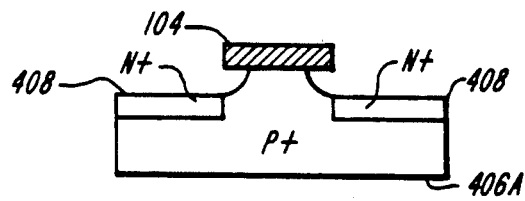

As shown in FIG. 39, the recessed layer 406 is doped N+ providing regions 408 in the P-type semiconductor substrate material 406A.

Figure 40:
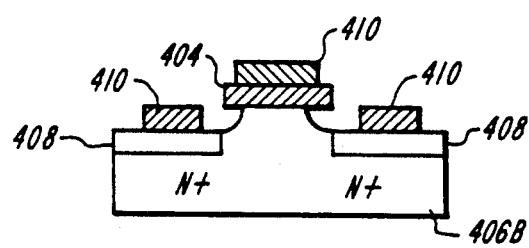

As shown in FIG. 40, a second deposition of nitride 410 is provided on the previous nitride coating 404 as well as the N+ doped regions 408 by conventional mask technology. The substrate 406B is then subjected to further etching resulting in deepened recesses 412 in the substrate material 406 where not covered by the nitride coating 410.

Figure 41:
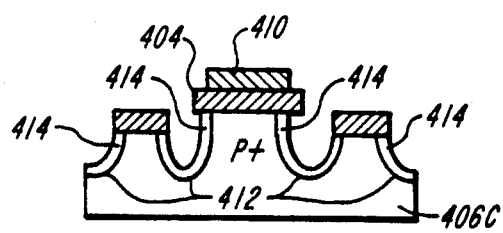

As shown in FIG. 41, a thermal oxide passivation layer 414 is grown on the substrate material 406C. Subsequently, the nitride protective layers 410, as well as the previous nitride protective coating 404 are selectively removed by a process which does not attack oxide, such as by etching in phosphoric acid or by plasma etching techniques. The elevated region 416 of the substrate 406 is then bonded to a second semiconductor material 418, which is of a different polarity, in this case an N-type semiconductor material.

Figure 42:
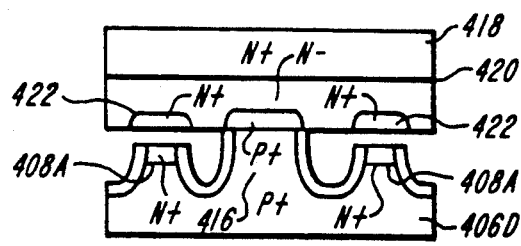

As further shown in FIG. 42, channel stop structures 422 are provided as a result of the transfer of the dopant from the regions 408A which were previously doped as discussed above.

Figure 43:
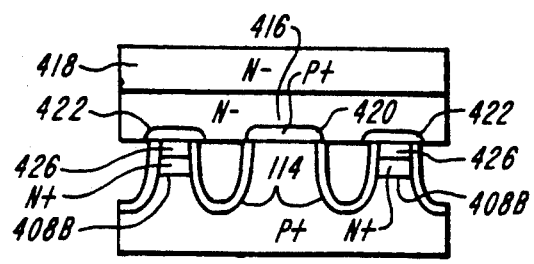
FIG. 43 is a cross-sectional view of a diode processed according to an alternate embodiment of FIG. 42.

If the passivation layer 414 is allowed to extend over the protective nitride layer 410, the alternative semiconductor structure of FIG. 43 can be produced. After the thermal oxide passivation layer 414 is grown, the nitride layers are removed. The central mesa area 416 is protected and cavities 426 are formed above the regions 408A. Thus, the passivation layer 414 provides nonconductive sidewalls which extends to the confronting semiconductor surface to selectively restrict the diffusion of dopant from the region 408 to form the channel stop structure 422 in the N-type material 418. Furthermore, the highly doped region of the channel stop is isolated from the other portions of the semiconductor and would not contribute to the capacity of the semiconductor junction 120.

In an alternate process according to the present embodiment, as illustrated by FIGS. 44-47, the semiconductor substrate 430 is doped in regions 432. Next, the substrate 430 is subjected to an etchant to selectively recess the surface thereof, producing a raised central mesa portion 434, as shown in FIG. 45. An elevation of the central mesa of 1-3 microns is all that is necessary, although a larger elevation is within the scope of this invention. The substrate 430A of FIG. 45 is selectively coated with nitride protective layers 436 and subjected to a further etching process to provide deepened recesses 438 in areas unprotected by the nitride protective coating. As shown in FIG. 46, a thermal oxide passivation layer 440 is then grown. The nitride layers 436 are then removed from the substrate 430B.

Finally, as shown in FIG. 47, the raised central region 434 is bonded to an N-type semiconductor material 442 wherein a PN junction is formed at 444. Furthermore, a channel stop structure 446 is formed within the semiconductor material 442 as a result of dopant transfer from the doped region 432A of the semiconductor material 430C through the void 448.

13. The embodiments discussed so far involve an epitaxial layer on one of the semiconductor material prior to bonding. An epitaxial layer is not required for the fabrication of a diode. A typical example would be a Zener diode 450, as shown FIG. 48. In this Zener diode construction, the P+ semiconductor material 452 is bonded to the N+ semiconductor material 454 directly. This structure has several advantages over the conventional double diffused or single diffused epitaxial layer construction, in that dopant compensation is not required. Each semiconductor material can be individually optimized before bonding by choosing the substrate resistivity or by doping before bonding. This allows selective control of the breakdown voltage. For low breakdown voltage applications this embodiment is suited to the co-pending patent application entitled WAFER BONDING USING LOW TEMPERATURE NEUTRAL ALLOYS, U.S. Ser. No. 07/202,112 which allows bonding at temperatures as low as 900° C. Even with the higher temperature bonding, this technique is capable of producing low breakdown voltage Zener diodes as well as other high field, abrupt junction devices, such as tunnel diodes. These diodes would also benefit from field plates and other enhancements previously discussed.

A second type of Zener or controlled breakdown diode 455, FIG. 49, is the bi-directional Zener diode having a controlled breakdown in both direction. The construction of this diode is the same as the embodiment in this invention for the mesa junction construction, except that the two heavily doped semiconductor materials 456, 458 are of the same type and doping, as shown in FIG. 49 for a P+/N/P+ construction, although an N+/P/N+ is also included.

Substitutions and modifications to the steps and materials of the present invention made by one of ordinary skill in the art is considered to be within the scope of the present invention. Furthermore, the addition of steps by one of skill in the art, such as the application of a further insulator oxide in the void area 448, or the addition of other semiconductor process steps, is considered to be within the scope of the present invention, which is not to be limited except by the claims which follow.

What is claimed is:

1. A diode comprising:
a first semiconductor material and
a second semiconductor material;
said first semiconductor material having a first planar surface confronting a first planar surface of said second semiconductor material;
each of said first and second semiconductor materials having a second, outwardly facing planar surface;
said first semiconductor material outwardly facing planar surface including a first, diode surface contact region, said second semiconductor material outwardly facing planar surface including a second, diode surface contact region, each of said first and second diode surface contact regions having a surface area generally equal in size; and
wherein at least one said confronting planar surfaces of said first and second semiconductor materials have a recessed surface area thereon, providing a mesa having a planar surface area, said mesa planar surface area being bonded to the confronting surface of the other of said first and second semiconductor material, a diode PN junction formed in the region of said mesa and said second semiconductor material, said first and second diode surface contact regions each having a surface area substantially greater in size than said mesa planar surface area.

2. A diode of claim 1 wherein
at least one of said first semiconductor and second semiconductor material includes a region, proximate said mesa, which has been doped with a doping material.

3. The diode of claim 2, wherein
said region which has been doped with doping material forms a region with a polarity which is opposite that of the polarity of said at least one semiconductor material including said doped region and, wherein a PN junction is formed at a junction between said doped region of opposite polarity and said at least one semiconductor material including said doped region.

4. The diode of claim 3, wherein
at least one of said first and second semiconductor material comprises both a heavily doped region and a lightly doped region, and wherein the bonding of the first semiconductor material to the second semiconductor material is formed between said lightly doped region of one of said first and second semiconductor material and the other of said at least first and second semiconductor materials.

5. The diode of claim 3, wherein
at least one of said first and said second semiconductor material is heavily doped.

6. The diode of claim 1, further including
a passivating layer disposed on at least a portion of the recessed surface areas of said at least one of said first and second semiconductor materials.

7. The diode of claim 1, wherein
said PN junction is formed at the bond between said mesa planar surface area and said confronting surface of one of said first and second semiconductor materials.

8. The diode of claim 1, wherein
said planar surface area of said mesa is defined by the form of one of a circle, and ellipse, an annulus and a polygon.

9. The diode of claim 1, wherein
said mesa includes a base region area adjacent said recessed surface area, and wherein the area of said base region is greater than the area of said mesa planar surface.

10. The diode of claim 1, wherein
at least one of said first and said second semiconductor material is connected to an electrically conductive member.

11. The diode of claim 1, further comprising
means for hermetically sealing said first and said second semiconductor material.

12. The diode of claim 3, wherein
the PN junction is hermetically sealed.

13. The diode of claim 10, wherein said electrically conductive member is selected from wire, pins and disks.

14. The diode of claim 9, wherein
said mesa includes a periphery having at least one step which forms a stepped reduction in mesa cross-sectional area, for providing at least one field plate area on said step.

15. The diode of claim 1, wherein said recessed surface area provides a plurality of physically separate coplanar mesas formed on at least one of said first and second semiconductor materials.

16. The diode of claim 15, wherein a passivating layer is disposed on at least a portion of said recessed surface area of said at least one of said first and second semiconductor materials.

17. A diode comprising:
a first semiconductor material having a planar surface;
a second semiconductor material having a recessed surface area thereon, and including
a first mesa having a planar surface area substantially surrounded by said recessed surface area, said first mesa bonded to said first semiconductor material;
at least one second mesa provided on said second semiconductor material and having a planar surface area with an elevation below the planar surface area of said first mesa;
said bonding of the first and second semiconductor materials forming a gap between the planar surface area of said at least one second mesa, the recessed surface area of said second semiconductor material and the planar surface of said first semiconductor material; and
an insulating layer disposed on the recessed surface area portions of said second semiconductor material and on the planar surface of said first semiconductor material, said insulating layer extending to the planar surface area of said first mesa, said insulating layer substantially filling the gap between the planar surface area of said at least one second mesa and the planar surface of said bonded first semiconductor material.

18. The diode of claim 17, further comprising a plurality of said second mesas provided on said second semiconductor material.

19. The diode of claim 17, wherein said at least one second mesa comprises annular region surrounding said first mesa.

20. A semiconductor device comprising:
a first semiconductor material having,
a first elevated mesa region, and
a second elevated mesa region of lesser elevation than said first elevated mesa region and including a semiconductor dopant therein; and
a second semiconductor material bonded to said first elevated mesa region of said first semiconductor material, said second semiconductor material including a dopant diffused region disposed opposite to said second elevated mesa region of said first semiconductor material, said dopant diffused region formed by diffusion of dopant from the second elevated mesa region of said first semiconductor material to said second semiconductor material.

21. The semiconductor device of claim 20, further including:
means for restricting diffusion of dopant from said second elevated mesa region of said first semiconductor material to said second semiconductor material to an area substantially corresponding to the surface area of said second elevated mesa region.

22. The semiconductor device of claim 20, wherein
said second elevated mesa region comprises an annular region, and
said dopant diffused region in said second semiconductor material having dopant diffused therein comprises an annular region.

23. The semiconductor device of claim 22, wherein
said annular region in said second semiconductor material surrounds a PN junction and further comprises a channel stop.

* * * * *